(12) United States Patent
Luan et al.

(10) Patent No.: US 10,743,417 B2
(45) Date of Patent: Aug. 11, 2020

(54) FLEXIBLE DISPLAY DEVICE AND METHOD OF MANUFACTURING THE SAME

(71) Applicant: E Ink Holdings Inc., Hsinchu (TW)

(72) Inventors: Ta-Nien Luan, Hsinchu (TW);
Chi-Ming Wu, Hsinchu (TW);
Tsung-Chin Lin, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 0 days.

(21) Appl. No.: 16/197,384

(22) Filed: Nov. 21, 2018

(65) Prior Publication Data

US 2019/0182959 A1 Jun. 13, 2019

(30) Foreign Application Priority Data

Dec. 13, 2017 (TW) ............................... 106143780 A
Feb. 13, 2018 (TW) ............................... 107105344 A (51) Int. Cl.
*H05K 1/00* (2006.01)
*H05K 1/18* (2006.01)
(Continued)

(52) U.S. Cl.
CPC ............ *H05K 1/189* (2013.01); *G06F 1/1652* (2013.01); *H01L 27/3244* (2013.01);
(Continued)

(58) Field of Classification Search
CPC .......... H05K 1/189; H05K 3/284; H05K 3/28; H05K 2201/10128; H01L 51/5246; H01L 51/524; H01L 51/56; H01L 51/5253; H01L 51/0097; H01L 27/3244; H01L 2251/5338; H01L 51/525; G06F 1/1652
(Continued)

(56) References Cited

U.S. PATENT DOCUMENTS 7,826,124 B2 11/2010 Xu et al.
8,259,078 B2 9/2012 Hotelling et al.
(Continued)

FOREIGN PATENT DOCUMENTS

CN 103022378 A 4/2013
CN 102610607 B 7/2014
(Continued)

OTHER PUBLICATIONS

Corresponding Taiwan office action dated Aug. 10, 2018.
(Continued)

*Primary Examiner* — Yuriy Semenenko
(74) *Attorney, Agent, or Firm* — CKC & Partners Co., LLC (57) ABSTRACT

A method of manufacturing a flexible display device includes: forming an integrated circuit chip, a flexible printed circuit board and a frontplane laminate over a driving substrate; adhering a front protective layer over the frontplane laminate and the flexible printed circuit board, such that the front protective layer is in contact with the frontplane laminate, in which the front protective layer has a first opening corresponding to the integrated circuit chip; and filling a second adhesive into the first opening and covering an upper surface, a side surface or a combination thereof of the integrated circuit chip. A flexible display device is also provided.

11 Claims, 6 Drawing Sheets

(51) Int. Cl.
*G06F 1/16* (2006.01)
*H05K 3/28* (2006.01)
*H01L 51/52* (2006.01)
*H01L 27/32* (2006.01)
*H01L 51/00* (2006.01)
*H01L 51/56* (2006.01)

(52) U.S. Cl.
CPC ........ *H01L 51/0097* (2013.01); *H01L 51/524* (2013.01); *H01L 51/5246* (2013.01); *H01L 51/5253* (2013.01); *H01L 51/56* (2013.01); *H05K 3/28* (2013.01); *H05K 3/284* (2013.01); *H01L 2251/5338* (2013.01); *H05K 2201/10128* (2013.01)

(58) Field of Classification Search
USPC .......................................................... 361/749
See application file for complete search history.

(56) References Cited

U.S. PATENT DOCUMENTS

| | | | | |
|---|---|---|---|---|
| 8,492,969 | B2* | 7/2013 | Lee | ........................ H05B 33/04 |
| | | | | 313/504 |
| 8,953,117 | B2 | 2/2015 | Rosenau et al. | |
| 8,982,575 | B2 | 3/2015 | Lai et al. | |
| 9,201,531 | B2 | 12/2015 | Hsieh et al. | |
| 9,412,873 | B1* | 8/2016 | Kraeutle | ............ G02F 1/133308 |
| 2001/0044170 | A1 | 11/2001 | Muramatsu | |
| 2003/0020152 | A1 | 1/2003 | Inoue et al. | |
| 2008/0013030 | A1 | 1/2008 | Fujita | |
| 2014/0055028 | A1* | 2/2014 | Yi | ........................ H05B 33/04 |
| | | | | 313/498 |
| 2014/0192491 | A1* | 7/2014 | Chiang | ................... H05K 3/32 |
| | | | | 361/750 |
| 2016/0225959 | A1* | 8/2016 | Pan | ....................... H01L 33/502 |
| 2016/0313478 | A1* | 10/2016 | Lee | ....................... G02B 5/0242 |
| 2017/0013722 | A1* | 1/2017 | Kim | ....................... H01L 24/27 |

FOREIGN PATENT DOCUMENTS

| | | |
|---|---|---|
| CN | 103913920 A | 7/2014 |
| CN | 102543899 B | 4/2016 |
| CN | 103199199 B | 6/2016 |
| TW | I457875 B | 10/2014 |
| TW | I484276 B | 5/2015 |

OTHER PUBLICATIONS

Corresponding Taiwan office action dated Nov. 8, 2018.
Notice of Allowance for U.S. Appl. No. 16/145,194 dated Aug. 5, 2019.

* cited by examiner

FLEXIBLE DISPLAY DEVICE AND METHOD OF MANUFACTURING THE SAME

CROSS-REFERENCE TO RELATED APPLICATION

This application claims priority to Taiwan Application Serial Number 107105344, filed Feb. 13, 2018, and Taiwan Application Serial Number 106143780, filed Dec. 13, 2017, which are herein incorporated by references.

BACKGROUND

Field of Invention

The present disclosure relates to a flexible display device and a method of manufacturing the flexible display device.

Description of Related Art

In conventional flexible display devices, an optical grade adhesive film is generally attached on a frontplane laminate and an integrated circuit chip to fill height difference between the frontplane laminate and the integrated circuit chip, but it will result in increase of total thickness of the flexible display device. In addition, when attaching the optical grade adhesive film, air bubbles may be formed due to the height difference, and thus not only to affect the appearance but also to lead Mura phenomenon due to water vapor infiltration.

SUMMARY

A purpose of the present disclosure is to provide a flexible display device and a method of manufacturing the flexible display device. A front protective layer is directly adhered over a frontplane laminate without use of an optical grade adhesive film, and the front protective layer has an opening corresponding to an integrated circuit chip, and an adhesive is then filled into the opening and covering an upper surface, a side surface or a combination thereof of the integrated circuit chip. As such, total thickness of the flexible display device is not increased, and adverse effects due to bonding of the optical grade adhesive film will not occur.

The present disclosure provides a method of manufacturing a flexible display device, the method including: forming an integrated circuit chip, a flexible printed circuit board and a frontplane laminate over a driving substrate; adhering a front protective layer over the frontplane laminate and the flexible printed circuit board, such that the front protective layer is in contact with the frontplane laminate, in which the front protective layer has a first opening corresponding to the integrated circuit chip; and filling a second adhesive into the first opening and covering an upper surface, a side surface or a combination thereof of the integrated circuit chip.

According to some embodiments of the present disclosure, the method further includes filling a first adhesive surrounding the integrated circuit chip before adhering the front protective layer over the frontplane laminate and the flexible printed circuit board.

According to some embodiments of the present disclosure, filling the second adhesive into the first opening and covering the integrated circuit chip further includes filling the second adhesive into a space between the front protective layer and the flexible printed circuit board, and the space communicated with the first opening.

According to some embodiments of the present disclosure, the method further includes forming a spacer substantially aligned with a corner of the front protective layer before filling the second adhesive into the first opening and covering the integrated circuit chip, and filling the second adhesive into the first opening and covering the integrated circuit chip further comprising filling the second adhesive to be in contact with the spacer.

According to some embodiments of the present disclosure, the method further includes adhering a back protective layer to another surface of the driving substrate opposite to the frontplane laminate, and filling a third adhesive between the back protective layer and the driving substrate.

The present disclosure also provides a flexible display device, which includes a driving substrate; a frontplane laminate, an integrated circuit chip and a flexible printed circuit board disposed over the driving substrate; a front protective layer disposed over the frontplane laminate and the flexible printed circuit board and in contact with the frontplane laminate, in which the front protective layer has a first opening corresponding to the integrated circuit chip; and a second adhesive disposed in the first opening and covering the integrated circuit chip.

According to some embodiments of the present disclosure, the flexible display device further includes a first adhesive disposed beneath the first opening and surrounding the integrated circuit chip.

According to some embodiments of the present disclosure, the second adhesive is further disposed between the front protective layer and the flexible printed circuit board.

According to some embodiments of the present disclosure, the front protective layer further has a second opening aligned with a portion of the driving substrate, a portion of the flexible printed circuit board or a combination thereof, and the second adhesive is further disposed in the second opening.

According to some embodiments of the present disclosure, a dimension of the first opening is greater than a dimension of the integrated circuit chip.

According to some embodiments of the present disclosure, the flexible display device further includes a spacer disposed between an edge of the front protective layer and an edge of the driving substrate.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "over" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
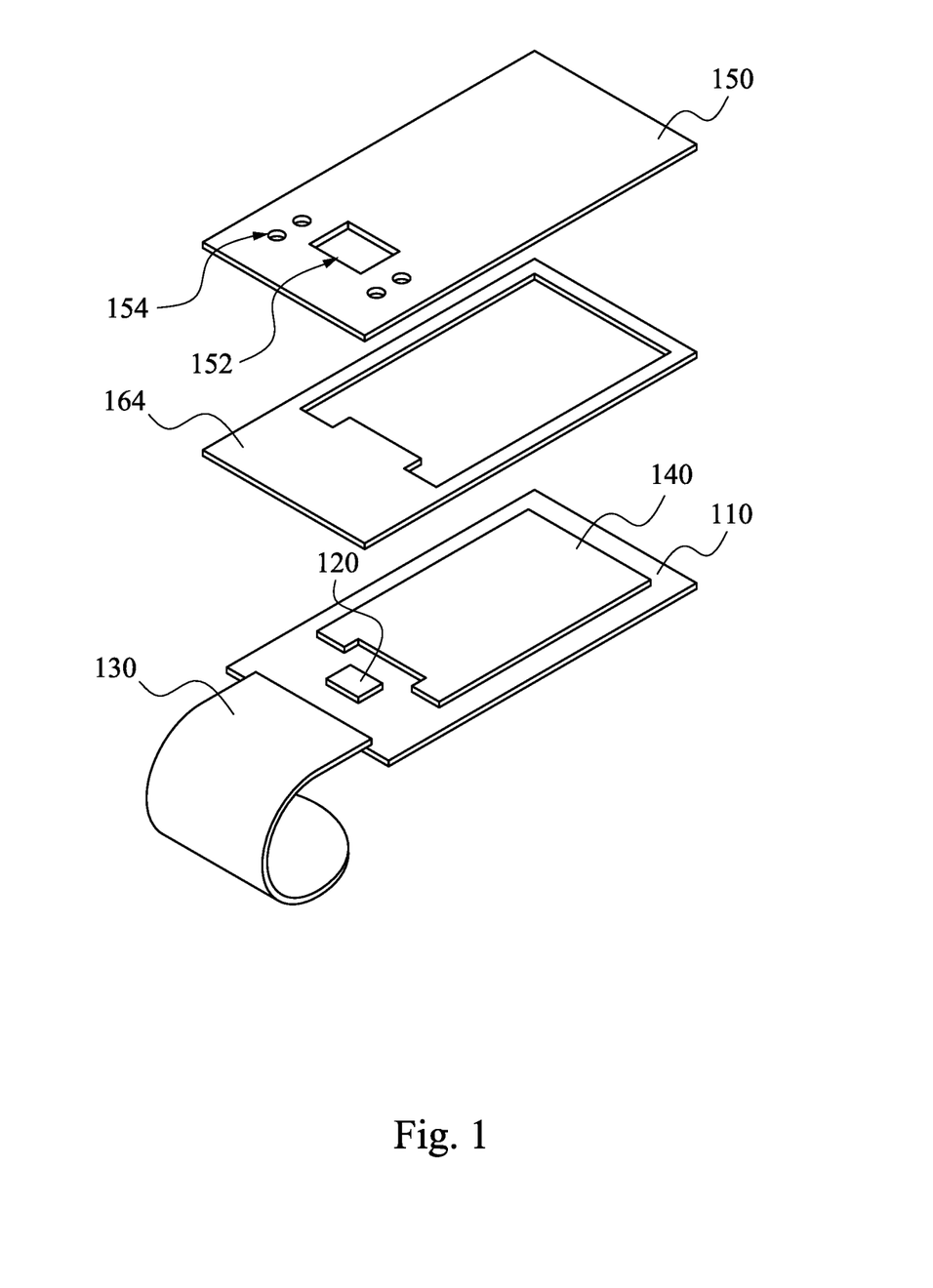
FIG. 1 is a perspective view of stages of manufacturing a flexible display device according to some embodiments of the present disclosure.
Figure 2:
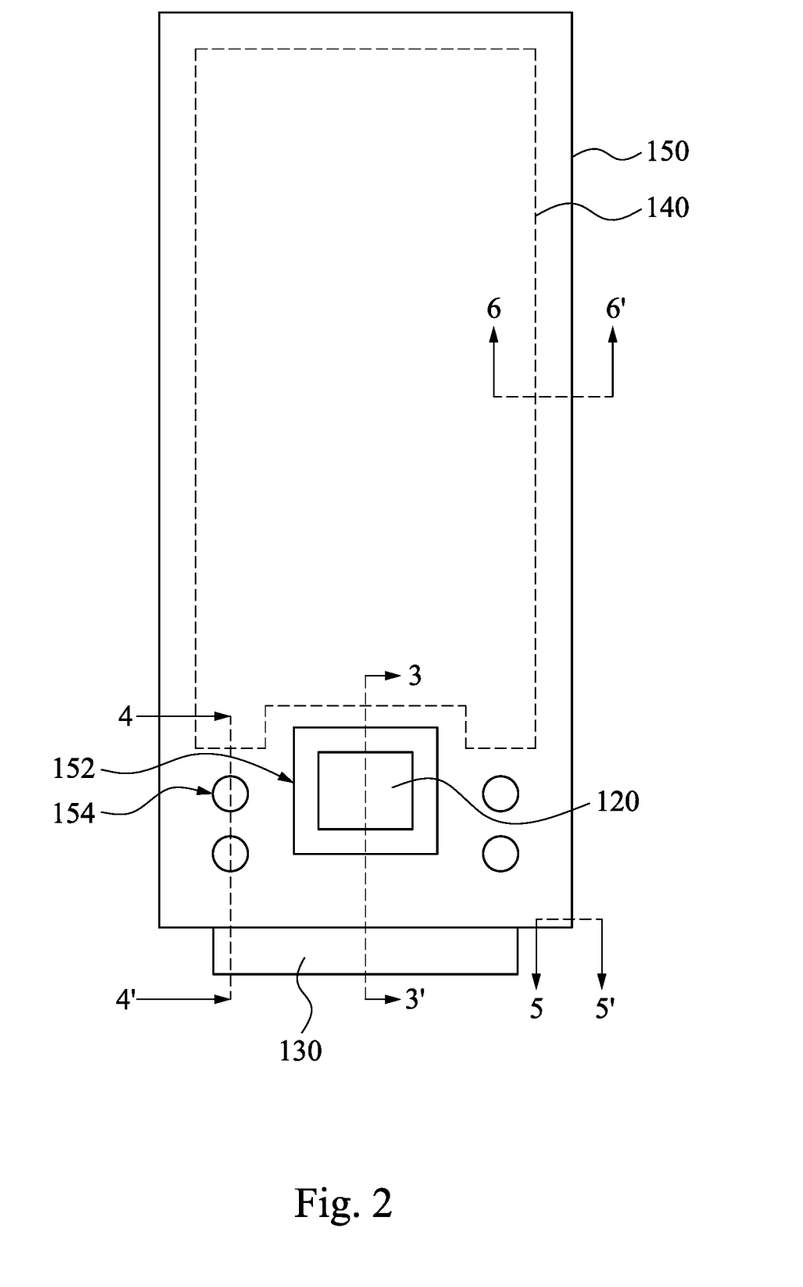
FIG. 2 is a top simplified view of a flexible display device according to some embodiments of the present disclosure.

The present disclosure provides a method of manufacturing a flexible display device. FIG. 1 is a perspective view of stages of manufacturing a flexible display device according to some embodiments of the present disclosure. FIG. 2 is a top simplified view of a flexible display device according to some embodiments of the present disclosure. FIGS. 3A-3D are cross-sectional views of each stage of manufacturing the flexible display device taken along a section line 3-3' of FIG. 2 according to some embodiments of the present disclosure.

Figure 3A:
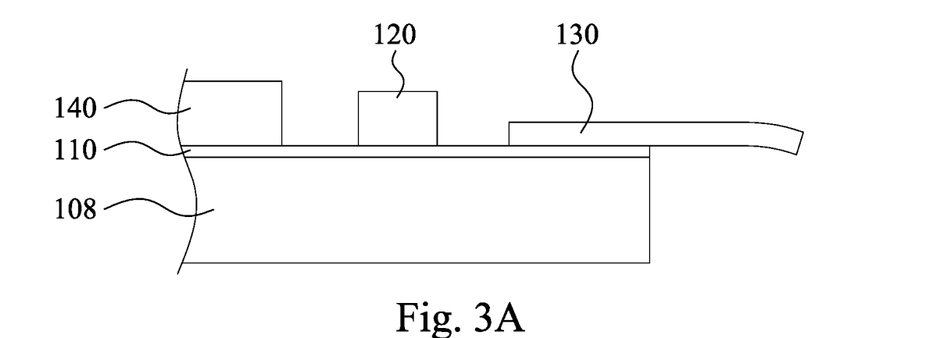
FIGS. 3A-3D are cross-sectional views of each stage of manufacturing the flexible display device taken along a section line 3-3' of FIG. 2 according to some embodiments of the present disclosure.

As shown in FIGS. 1 and 3A, an integrated circuit chip 120, a flexible printed circuit board 130 and a frontplane laminate 140 are formed over a driving substrate 110. In some embodiments, the integrated circuit chip 120 and the flexible printed circuit board 130 are firstly disposed over the driving substrate 110, and the frontplane laminate 140 is then disposed over the driving substrate 110. In some embodiments, the driving substrate 110 has a display region and a non-display region, and the integrated circuit chip 120 and the flexible printed circuit board 130 are disposed at the non-display region of the driving substrate 110, and the frontplane laminate 140 is disposed at the display region of the driving substrate 110.

In some embodiments, the driving substrate 110 is a thin film transistor array substrate. In some embodiments, the driving substrate 110 includes a flexible substrate and a driving circuit disposed thereover. In some embodiments, the flexible substrate includes polyimide, polyethylene terephthalate (PET), polyethylene naphthalate (PEN) or polymethacrylate (PMMA). In some embodiments, as shown in FIG. 3A, there is a rigid substrate 108 beneath the driving substrate 110. In some embodiments, the rigid substrate 108 may be a glass substrate, a quartz substrate or a rigid plastic substrate. In some embodiments, the frontplane laminate 140 includes an electrophoretic display layer (not shown) and a driving electrode layer (not shown) disposed over the electrophoretic display layer. In another embodiment, the frontplane laminate 140 may include an organic electroluminescent display layer.

Figure 3B:
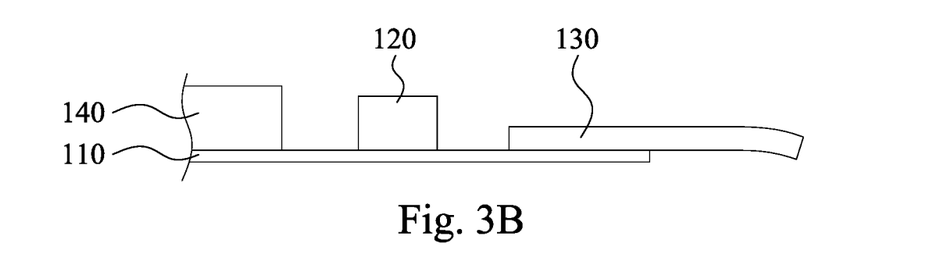

In some embodiments, as shown in FIGS. 3A and 3B, after forming the integrated circuit chip 120, the flexible printed circuit board 130 and the frontplane laminate 140 over the driving substrate 110, the rigid substrate 108 is removed.

Figure 3C:
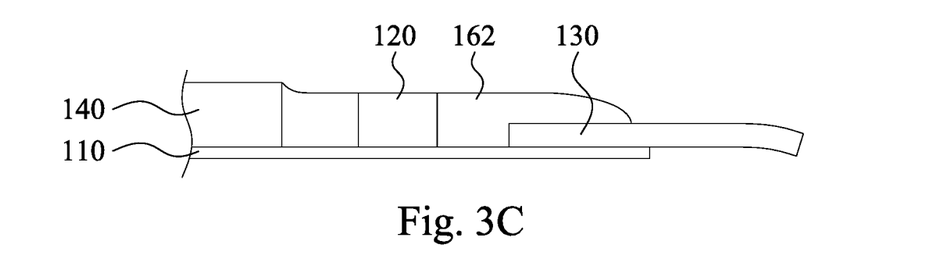

In some embodiments, as shown in FIGS. 3A and 3C, before removing the rigid substrate 108, a first adhesive 162 is filled surrounding the integrated circuit chip 120, such that the structure after removing the rigid substrate 108 has sufficient supportability. In some embodiments, as shown in FIG. 3C, the first adhesive 162 further covers a portion of the flexible printed circuit 130.

After filling the first adhesive 162, a curing process, such as a thermal curing process or an ultraviolet curing process, is performed. In some embodiments, the first adhesive 162 is a waterproof adhesive, which has fluidity at ambient temperature. In some embodiments, the first adhesive 162 is a silicon-based or epoxy-based adhesive.

Figure 3D:
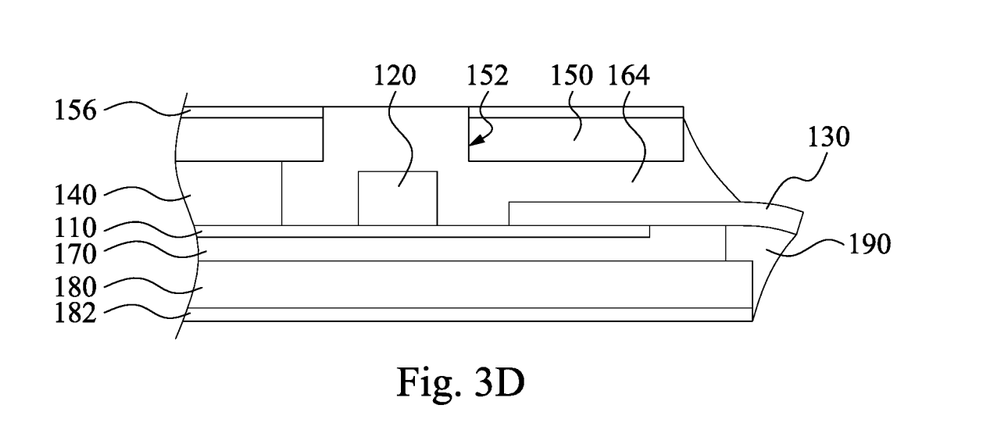

In some embodiments, as shown in FIGS. 3B and 3D, an adhesive layer 170 and a back protective layer 180 are sequentially adhered over a lower surface of the driving substrate 110, and an adhesive 190 is then filled surrounding an edge of the adhesive layer 170 and an edge of the back protective layer 180. In some embodiments, the adhesive layer 170 is an optical grade adhesive layer. In some embodiments, the back protective layer 180 is made of polyethylene terephthalate or polyethylene naphthalate. In some embodiments, the adhesive 190 is a UV curable adhesive or a thermal curable adhesive. In some embodiments, there is a mask film 182 over the back protective layer 180.

As shown in FIGS. 1 and 3D, a front protective layer 150 is adhered over the frontplane laminate 140 and the flexible printed circuit board 130, such that the front protective layer 150 is in contact with the frontplane laminate 140. In some embodiments, after sequentially adhering the adhesive layer 170 and the back protective layer 180 are filling the adhesive 190, the front protective layer 150 is adhered over the frontplane laminate 140 and the flexible printed circuit board 130. In some embodiments, there is a mask film 156 over the front protective layer 150. In some embodiments, the front protective layer 150 is made of polyethylene terephthalate or polyethylene naphthalate.

It is noted that since the front protective layer 150 is directly adhered over the frontplane laminate 140 rather than an optical grade adhesive film is adhered over the frontplane laminate 140, total thickness of the flexible display device is not increased, and adverse effects due to bonding of the optical grade adhesive film will not occur. In some embodiments, the thickness of the flexible display device of the present disclosure is less than or equal to 75% of the thickness of the flexible display device that the optical grade adhesive film is adhered over the frontplane laminate.

In addition, since the front protective layer 150 covers the non-display region of the driving substrate and a portion of the flexible printed circuit board 130, the problem of crack of exposed circuit due to the front protective layer not covering the non-display region of the driving substrate and the problem of stress streaks caused by bending the flexible printed circuit board may be solved.

As shown in FIGS. 1, 2 and 3D, the front protective layer 150 has a first opening 152 corresponding to the integrated circuit chip 120. The front protective layer 150 has a first opening 152 substantially aligned with the integrated circuit chip 120. The term "substantially aligned" used herein refers to a vertical projection of the front protective layer 150 overlapped with a vertical projection of the integrated circuit chip 120. Preferably, the vertical projection of the integrated circuit chip 120 falls within the vertical projection of the front protective layer 150. In some embodiments, a dimension of the first opening 152 is greater than a dimension of the integrated circuit chip 120. The term "dimension" used herein refers to the dimension constituted by length and width of the element in top view.

Subsequently, as shown in FIGS. 1 and 3D, after adhering the front protective layer 150, a second adhesive 164 is filled into the first opening 152 and covering an upper surface, a side surface, or the upper surface and the side surface of the integrated circuit chip 120. In some embodiments, the second adhesive 164 is further filled into a space between the front protective layer 150 and the flexible printed circuit board 130, and the space is communicated with the first opening 152. In some embodiments, the second adhesive 164 is further filled into a space between the frontplane laminate 140 and the integrated circuit chip 120, and the space is communicated with the first opening 152.

After filling the second adhesive 164, a curing process, such as a thermal curing process or an ultraviolet curing process, is performed. In some embodiments, the second adhesive 164 is a waterproof adhesive, which has fluidity at ambient temperature. In some embodiments, the second adhesive 164 is a silicon-based or epoxy-based adhesive. In some embodiments, the material of the second adhesive 164 is same as or different from that of the first adhesive 162.

Figure 4A:
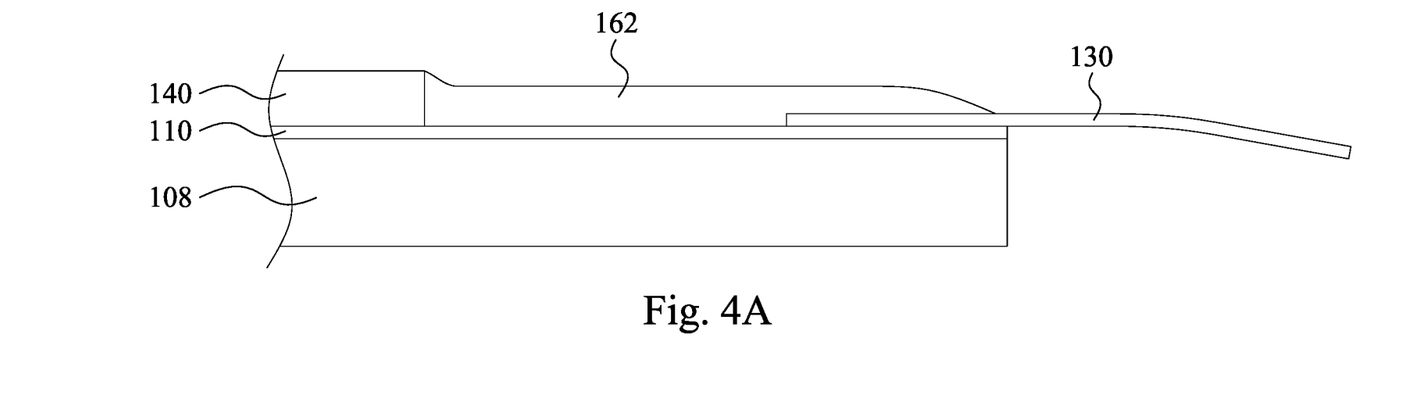
FIGS. 4A-4B are cross-sectional views of each stage of manufacturing the flexible display device taken along a section line 4-4' of FIG. 2 according to some embodiments of the present disclosure.
Figure 4B:
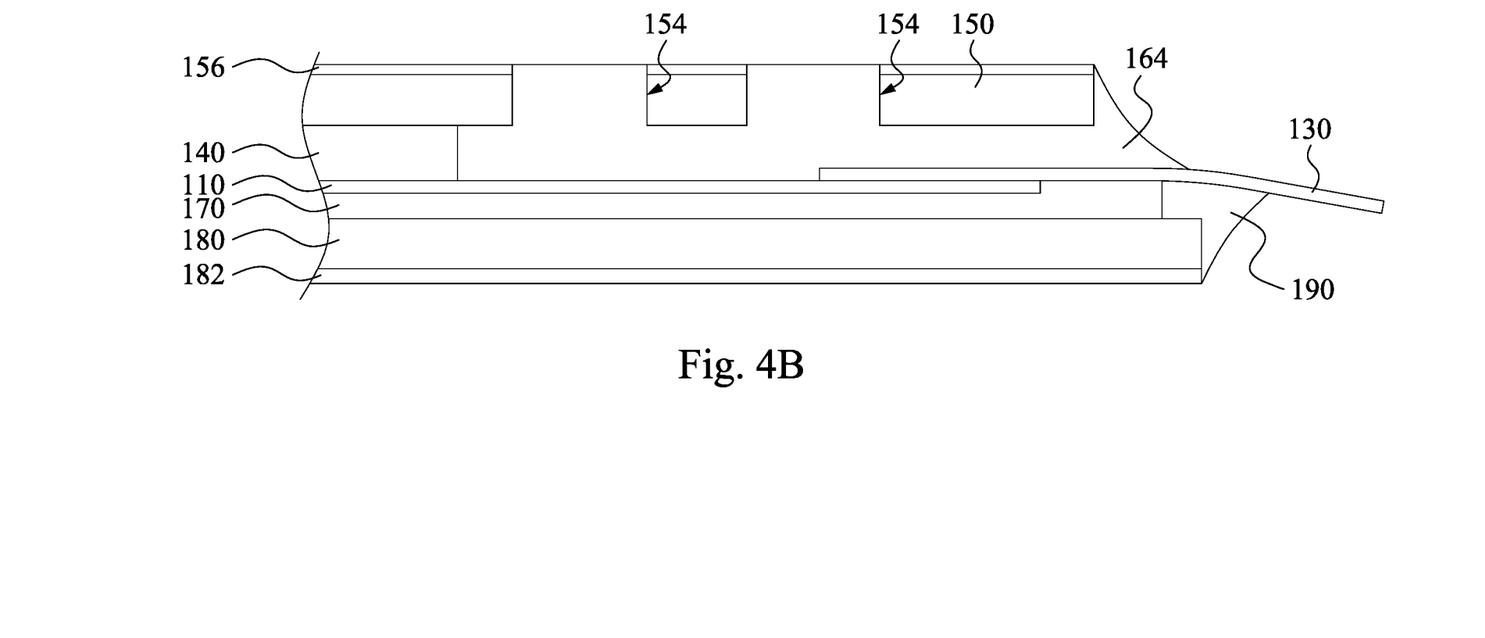

FIGS. 4A-4B are cross-sectional views of each stage of manufacturing the flexible display device taken along a section line 4-4' of FIG. 2 according to some embodiments of the present disclosure. As shown in FIG. 4A, the flexible printed circuit board 130 and the frontplane laminate 140 are firstly formed over the driving substrate 110, and the first adhesive 162 is then formed over the driving substrate 110 and the flexible printed circuit board 130. However, in another embodiment, the first adhesive 162 may not be formed over the driving substrate 110 and the flexible printed circuit board 130. As shown in FIG. 4A, the rigid substrate 108 beneath the driving substrate 110 may be used to carry the driving substrate 110.

Next, as shown in FIG. 4B, the rigid substrate 108 is removed, and the adhesive layer 170 and the back protective layer 180 are sequentially adhered over the lower surface of the driving substrate 110, and the adhesive 190 is then filled surrounding the edge of the adhesive layer 170 and the edge of the back protective layer 180.

As shown in FIG. 4B, the front protective layer 150 is adhered over the frontplane laminate 140 and the flexible printed circuit board 130, such that the front protective layer 150 is in contact with the frontplane laminate 140. In some embodiments, as shown in FIGS. 1, 2 and 4B, the front protective layer 150 has one or more second openings 154 aligned with a portion of the driving substrate 110, a portion of the flexible printed circuit board 130 or a combination thereof.

Subsequently, as shown in FIGS. 1 and 4B, after adhering the front protective layer 150, the second adhesive 164 is filled into the first opening 152 and the second opening 154. The more openings, the more positions that the second adhesive 164 are capable of being filled, and the faster the second adhesive 164 spread between the front protective layer 150 and the driving substrate 110. In some embodiments, as shown in FIG. 4B, the second adhesive 164 is further filled to an edge of the frontplane laminate 140. In some embodiments, the second adhesive 164 is further filled to a space between the front protective layer 150 and the flexible printed circuit board 130, and the space is communicated with the second opening 154.

Figure 5A:
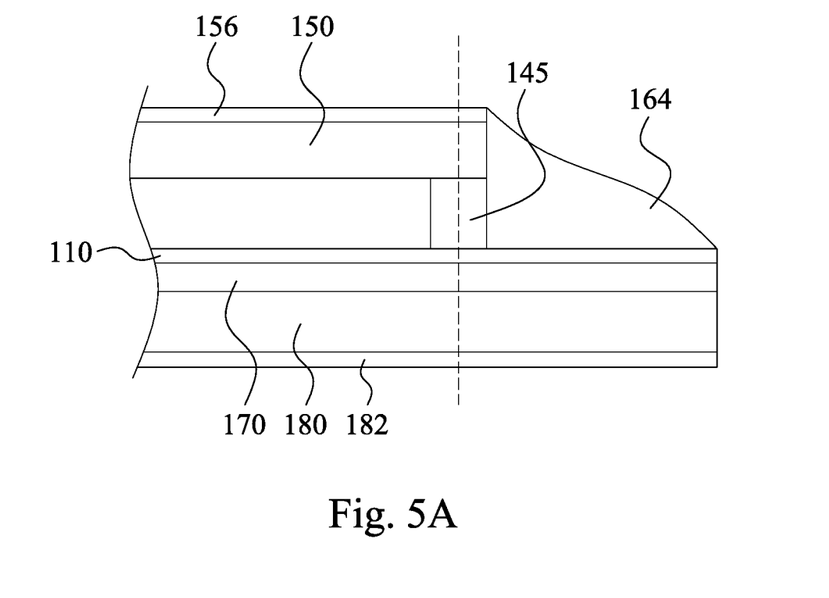
FIGS. 5A-5B are cross-sectional views of each stage of manufacturing the flexible display device taken along a section line 5-5' of FIG. 2 according to some embodiments of the present disclosure.
Figure 5B:
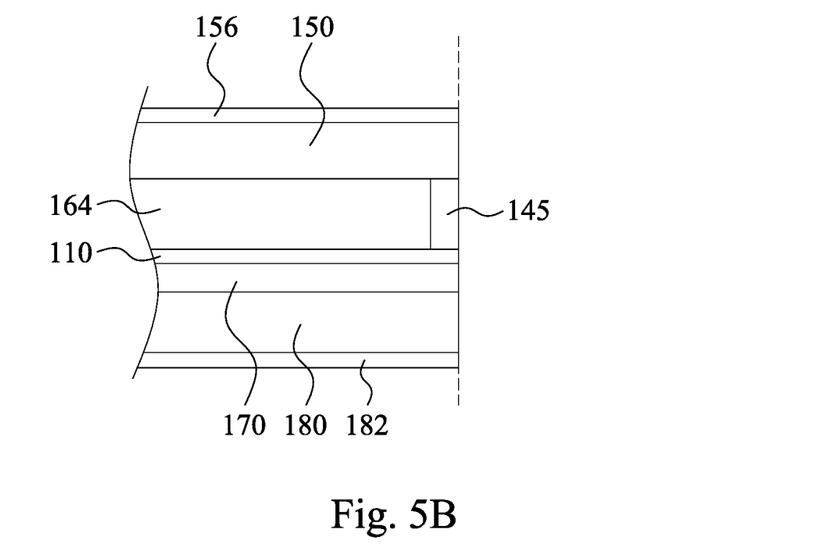

FIGS. 5A-5B are cross-sectional views of each stage of manufacturing the flexible display device taken along a section line 5-5' of FIG. 2 according to some embodiments of the present disclosure. As shown in FIG. 5A, after filling the second adhesive 164, a spacer 145 is formed substantially aligned with a corner of the front protective layer 150. The spacer 145 is configured to support the front protective layer 150. In some embodiments, the spacer 145 may be formed before or after adhering the front protective layer 150.

As shown in FIG. 5A, after adhering the front protective layer 150, the second adhesive 164 is filled to be in contact with the spacer 145. In some embodiments, a height of the spacer 145 is less than or equal to a distance between the frontplane laminate 150 and the driving substrate 110. As shown in FIG. 5A, the height of the spacer 145 is equal to the distance between the frontplane laminate 150 and the driving substrate 110. In some embodiments, the second adhesive 164 is further filled into a space between the front protective layer 150 and the driving substrate 110.

Subsequently, as shown in FIG. 5B, a peripheral region of the flexible display device is removed. In some embodiments, as shown in FIG. 5B, a portion of the spacer 145 is removed. However, in other embodiments, during removing the peripheral region of the flexible display device, the spacer 145 may be completely retained or completely removed, and not limited to the embodiments illustrated in FIG. 5B. In some embodiments, laser is used to cut the peripheral region of the flexible display device.

Figure 6A:
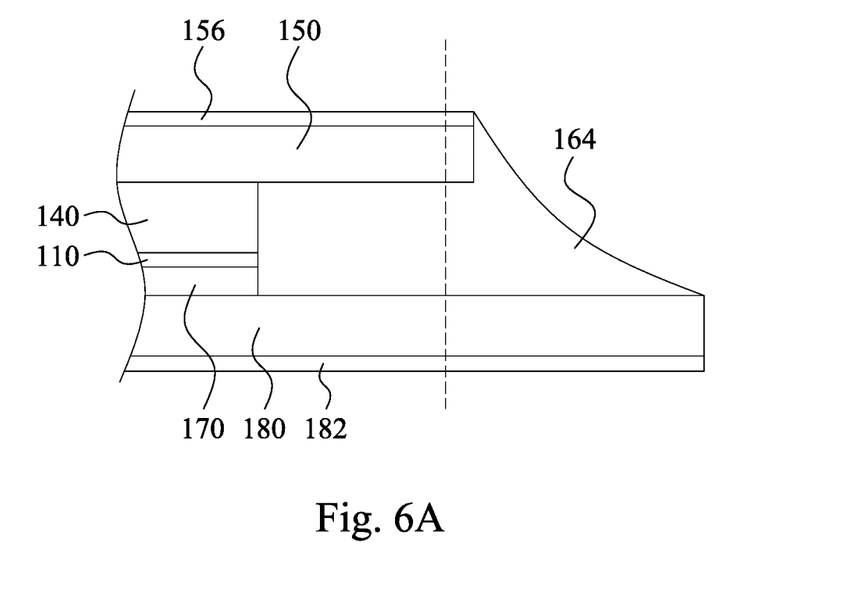
FIGS. 6A-6B are cross-sectional views of each stage of manufacturing the flexible display device taken along a section line 6-6' of FIG. 2 according to some embodiments of the present disclosure.
Figure 6B:
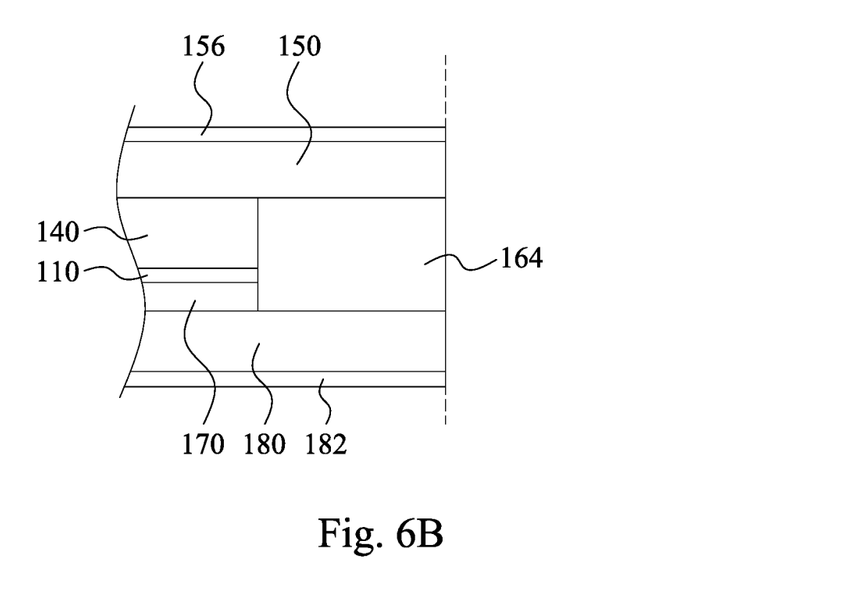

FIGS. 6A-6B are cross-sectional views of each stage of manufacturing the flexible display device taken along a section line 6-6' of FIG. 2 according to some embodiments of the present disclosure. As shown in FIG. 6A, after adhering the front protective layer 150, the second adhesive 164 is filled into a space between the front protective layer 150 and the back protective layer 180.

As shown in FIG. 6B, the peripheral region of the flexible display device is removed. In some embodiments, laser is used to cut the peripheral region of the flexible display device.

The present disclosure also provides a flexible display device. As shown in FIGS. 2 and 3D, the flexible display device includes a driving substrate 110, a frontplane laminate 140, an integrated circuit chip 120, a flexible printed circuit board 130, a front protective layer 150 and a second adhesive 164.

As shown in FIG. 3D, the frontplane laminate 140, the integrated circuit chip 120 and the flexible printed circuit board 130 are disposed over the driving substrate 110. In some embodiments, the driving substrate 110 has a display region and a non-display region, and the frontplane laminate 140 is disposed at the display region, and the integrated circuit chip 120 and the flexible printed circuit board 130 are disposed at the non-display region.

As shown in FIG. 3D, the front protective layer 150 is over the frontplane laminate 140 and the flexible printed circuit board 130 and in contact with the frontplane laminate 140. In some embodiments, the front protective layer 150 is made of polyethylene terephthalate or polyethylene naphthalate.

As shown in FIGS. 2 and 3D, the front protective layer 150 has a first opening 152 substantially aligned with the integrated circuit chip 120. In some embodiments, a dimension of the first opening 152 is greater than a dimension of the integrated circuit chip 120.

As shown in FIG. 3D, the second adhesive 164 is disposed in the first opening 152 and covering an upper surface, a side surface, or the upper surface and the side surface of the integrated circuit chip 120. In some embodiments, as shown in FIG. 3D, the second adhesive 164 is further disposed between the front protective layer 150 and the flexible printed circuit board 130. In some embodiments, as shown in FIG. 3D, the second adhesive 164 is further disposed between the frontplane laminate 140 and the integrated circuit chip 120. In some embodiments, the second adhesive 164 is a waterproof adhesive.

In some embodiments, as shown in FIGS. 3C and 3D, the flexible display device further includes a first adhesive 162 beneath the first opening 152 and surrounding the integrated circuit chip 120. In some embodiments, as shown in FIG. 3C, the first adhesive 162 further covers a portion of the flexible printed circuit 130 and a portion of the driving substrate 110. In some embodiments, the first adhesive 162 is a waterproof adhesive.

In some embodiments, as shown in FIGS. 2 and 4B, the front protective layer 150 further has one or more second openings 154 aligned with a portion of the driving substrate 110, a portion of the flexible printed circuit board 130 or a combination thereof. In some embodiments, the second adhesive 164 is further disposed in the second opening 154. However, position, size and distribution of the second openings 154 can be appropriately adjusted, and it is not limited to the embodiments illustrated in FIGS. 2 and 4B.

In some embodiments, as shown in FIG. 5B, the flexible display device further includes a spacer 145 disposed between an edge of the front protective layer 150 and an edge of the driving substrate 110.

As mentioned above, since in the method of manufacturing the flexible display device of the present disclosure, the front protective layer is directly adhered over the frontplane laminate rather than an optical grade adhesive film is adhered over the frontplane laminate, total thickness of the flexible display device is not increased, and adverse effects due to bonding of the optical grade adhesive film will not occur. In addition, a waterproof adhesive may be filled into the opening, and thus the flexible display device has waterproof function.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a flexible display device, the method comprising:

forming an integrated circuit chip, a flexible printed circuit board and a frontplane laminate over a driving substrate;

adhering a front protective layer over the frontplane laminate and the flexible printed circuit board, such that the front protective layer is in contact with the frontplane laminate, wherein the front protective layer has a first opening corresponding to the integrated circuit chip; and filling a second adhesive into the first opening and covering an upper surface, a side surface or a combination thereof of the integrated circuit chip.

2. The method of claim 1, further comprising:

filling a first adhesive surrounding the integrated circuit chip before adhering the front protective layer over the frontplane laminate and the flexible printed circuit board.

3. The method of claim 1, wherein filling the second adhesive into the first opening and covering the integrated circuit chip further comprises:

filling the second adhesive into a space between the front protective layer and the flexible printed circuit board, and the space communicated with the first opening.

4. The method of claim 1, further comprising:

forming a spacer substantially aligned with a corner of the front protective layer before filling the second adhesive into the first opening and covering the integrated circuit chip, and filling the second adhesive into the first opening and covering the integrated circuit chip further comprising filling the second adhesive to be in contact with the spacer.

5. The method of claim 1, further comprising:

adhering a back protective layer to another surface of the driving substrate opposite to the frontplane laminate, and filling a third adhesive between the back protective layer and the driving substrate.

6. A flexible display device, comprising:

a driving substrate;

a frontplane laminate, an integrated circuit chip and a flexible printed circuit board disposed over the driving substrate;

a front protective layer disposed over the frontplane laminate and the flexible printed circuit board and in contact with the frontplane laminate, wherein the front protective layer has a first opening corresponding to the integrated circuit chip; and a second adhesive disposed in the first opening and covering the integrated circuit chip.

7. The flexible display device of claim 6, further comprising:

a first adhesive disposed beneath the first opening and surrounding the integrated circuit chip.

8. The flexible display device of claim 6, wherein the second adhesive is further disposed between the front protective layer and the flexible printed circuit board.

9. The flexible display device of claim 6, wherein the front protective layer further has a second opening aligned with a portion of the driving substrate, a portion of the flexible printed circuit board or a combination thereof, and the second adhesive is further disposed in the second opening.

10. The flexible display device of claim 6, wherein a dimension of the first opening is greater than a dimension of the integrated circuit chip.

11. The flexible display device of claim 6, further comprising:

a spacer disposed between an edge of the front protective layer and an edge of the driving substrate.

* * * * *